US012276040B2

(12) United States Patent
Ou et al.

(10) Patent No.: US 12,276,040 B2
(45) Date of Patent: Apr. 15, 2025

(54) SINGLE CRYSTAL FURNACE CHARGING SYSTEM AND CHARGING METHOD

(71) Applicants: JINKO SOLAR CO., LTD., Jiangxi (CN); SICHUAN JINKO SOLAR CO., LTD., Leshan (CN)

(72) Inventors: Ziyang Ou, Jiangxi (CN); Yin Tang, Jiangxi (CN); Bo Xiong, Jiangxi (CN); Peng Xiang, Jiangxi (CN)

(73) Assignees: JINKO SOLAR CO., LTD., Jiangxi (CN); SICHUAN JINKO SOLAR CO., LTD., Sichuan (CN)

( * ) Notice: Subject to any disclaimer, the term of this patent is extended or adjusted under 35 U.S.C. 154(b) by 244 days.

(21) Appl. No.: 18/069,987

(22) Filed: Dec. 21, 2022

(65) Prior Publication Data
US 2024/0060207 A1    Feb. 22, 2024

(30) Foreign Application Priority Data
Aug. 16, 2022    (CN) .......................... 202210980899.2

(51) Int. Cl.
C30B 15/04    (2006.01)
C30B 15/20    (2006.01)
C30B 29/06    (2006.01)

(52) U.S. Cl.
CPC .............. *C30B 15/04* (2013.01); *C30B 15/20* (2013.01); *C30B 29/06* (2013.01)

(58) Field of Classification Search
CPC .......... C30B 15/20; C30B 15/04; C30B 29/06
See application file for complete search history.

(56) References Cited

U.S. PATENT DOCUMENTS 5,462,010 A *   10/1995   Takano ................... C30B 15/02
                                                117/214
2012/0056135 A1 *  3/2012  DeLuca ................ C30B 29/06
                                                206/524.1
(Continued)

FOREIGN PATENT DOCUMENTS

CN         103630219 A        3/2014
CN         105420806 A        3/2016
(Continued)

OTHER PUBLICATIONS

Jinko Solar Co., Ltd., et al., Extended European Search Report, EP 22215835.4, Aug. 10, 2023, 10 pgs.

*Primary Examiner* — Robert M Kunemund
(74) *Attorney, Agent, or Firm* — USCH Law, PC

(57) ABSTRACT

The single crystal furnace charging system includes a control system configured to send a charging request, a material preparation system configured to receive the charging request and prepare materials based on the charging request, a feeding system configured to receive the charging request, obtain the materials, and compare an actual feeding amount with a preset feeding amount to obtain a difference between the actual feeding amount and the preset charging amount, in response to the difference being within a first preset threshold, charge a single crystal furnace. The single crystal furnace charging system further includes a calibration system configured to obtain a total charging weight, and obtain a difference between the total charging weight and a preset charging amount of the single crystal furnace, in response to the difference being within a second preset threshold, update a total charging amount to the total charging weight.

20 Claims, 9 Drawing Sheets

(56) References Cited

U.S. PATENT DOCUMENTS

| | | |
|---|---|---|
| 2015/0252491 A1 | 9/2015 | Kwon et al. |
| 2021/0032769 A1* | 2/2021 | Agostini ................. C30B 29/06 |
| 2022/0205130 A1 | 6/2022 | Zardoni et al. |

FOREIGN PATENT DOCUMENTS

| | | | |
|---|---|---|---|
| CN | 108103568 | A | 6/2018 |
| CN | 111020700 | A | 4/2020 |
| CN | 112520437 | A | 3/2021 |
| CN | 112834003 | A | 5/2021 |
| CN | 110422635 | B | 7/2021 |
| CN | 113355738 | A | 9/2021 |
| CN | 114150369 | A | 3/2022 |
| CN | 114318506 | A | 4/2022 |
| CN | 114438584 | A | 5/2022 |
| CN | 216473575 | U | 5/2022 |
| CN | 114586691 | A | 6/2022 |
| EP | 0474810 | A1 | 3/1992 |

\* cited by examiner

Provide a material preparation system, where the material preparation system includes a first control unit and a feeding machine, the feeding machine includes a silicon material preparation box configured to store the silicon material of a preset weight, a dopant preparation device and a weight measure element; the silicon material preparation box is configured to store the silicon material of a preset weight, the dopant preparation device includes a storage box, the dopant is stored in the storage box, the storage box includes a discharge port, and the dopant is output to the silicon material preparation box through the discharge port; generating, by the first control unit, a preparation instruction in response to the charging request

↓

Measure, by the weight measure element, weight of a dopant to be output in response to the material preparation instruction, and in response to the weight of the dopant to be output being within a preset weight range, output the dopant to be output to the silicon material preparation box through the discharge port, and in response to the weight of the dopant to be output being not within the preset weight range, adjust an amount of the dopant to be output, and remeasuring the weight of the dopant to be output until the weight of the dopant to be output fall within the preset weight range

FIG. 10

Provide a feeding system and a transport system, where the feeding system includes a charging machine

↓

Receive, by the transport system, the charging request, transporting, by the transport system, to the feeding machine after a third preset time based on the charging request to obtain prepared materials, and transporting, by the transport system, the charging machine to the single crystal furnace after the prepared materials are obtained by the feeding system, where the third preset time is shorter than both the first preset time and the second preset time

↓

Provide a grasping device, where the grasping device grasp the material prepared by the material preparation system into the charging machine after the first preset time in response to the charging request, and the first preset time is longer than the third preset time and shorter than the second preset time

FIG. 11

SINGLE CRYSTAL FURNACE CHARGING SYSTEM AND CHARGING METHOD

CROSS-REFERENCE TO RELATED APPLICATION

The present disclosure claims the benefit of priority under the Paris Convention to Chinese Patent Application No. 202210980899.2 filed on Aug. 16, 2022, which is incorporated herein by reference in its entirety.

TECHNICAL FIELD

Embodiments of the present disclosure relate to the technical field of solar energy, and in particular to a single crystal furnace charging system and a charging method.

BACKGROUND

During preparation of single crystal silicon, a certain amount of silicon materials are transported into a single crystal furnace to be melted to prepare single crystal silicon. Currently, during charging the single crystal furnace, there will be such processes as material preparation, feeding and charging performed in sequence, so that the silicon material of a preset weight is fed into the single crystal furnace to obtain a crystal bar as expected.

However, currently, during preparation of single crystal silicon, a charging process needs to be performed manually to a great extent. In addition, performing the processes of material preparation, feeding, and charging is totally dependent on human beings, so, after multiple times of feeding and charging, a final charging amount in the single crystal furnace does not usually meet what is expected, resulting in an inefficient charging process performed on the single crystal furnace.

SUMMARY

A single crystal furnace charging system and a charging method are provided according to embodiments of the present disclosure, at least to improve a charging efficiency.

The single crystal furnace charging system is provided according to the embodiments of the present disclosure, and the single crystal furnace charging system includes a control system configured to send a charging request, a material preparation system configured to receive the charging request and prepare materials based on the charging request, a feeding system configured to receive the charging request, obtain the materials prepared by the material preparation system after a first preset time based on the charging request, and compare an actual feeding amount with a preset feeding amount to obtain a difference between the actual feeding amount and the preset charging amount, in response to the difference between the actual feeding amount and the preset feeding amount being within a first preset threshold, charge a single crystal furnace based on the charging request after a second preset time. The single crystal furnace charging system further includes a calibration system configured to obtain a total charging weight in the single crystal furnace, and obtain a difference between the total charging weight and a preset charging amount of the single crystal furnace, in response to the difference between the total charging weight and a preset charging amount of the single crystal furnace being within a second preset threshold, update a total charging amount in the single crystal furnace to the total charging weight.

In some embodiments, the materials include silicon material and dopant, and the material preparation system includes:
a first control unit, configured to generate a material preparation instruction in response to the charging request;
a feeding machine, where the feeding machine is configured to store the materials, and the feeding machine includes:
a silicon material preparation box, configured to store the silicon material of a preset weight;
a dopant preparation device, including a storage box, and the dopant is stored in the storage box, and the storage box includes a discharge port, and the dopant is output to the silicon material preparation box through the discharge port;
a weight measure element, configured to measure a weight of a dopant to be output in response to the material preparation instruction, and in response to the weight of the dopant to be output being within a preset weight range, output the dopant to be output to the silicon material preparation box through the discharge port, and in response to the weight of the dopant to be output being not within the preset weight range, adjust an amount of the dopant to be output, and remeasure the weight of the dopant to be output until the weight of the dopant to be output fall within the preset weight range.

In some embodiments, the feeding system includes:
a charging machine, where the charging machine includes a charging bin, and the charging bin is configured to store the materials;
a weighing unit, configured to weigh the materials in the charging bin and obtain a first feeding amount, which is the actual feeding amount;
a comparing unit, configured to receive the first feeding amount and compare the first feeding amount with the preset feeding amount to obtain a first difference between the first feeding amount and the preset feeding amount;
a determining unit, configured to receive the first difference and determine whether the first difference is within the first preset threshold or not, and in response to the first difference being within the first preset threshold, determine that it is time for the feeding system to charge the single crystal furnace.

In some embodiments, the weighing unit is further configured to, in response to the feeding system charging the single crystal furnace, perform real-time detection on a remaining feeding amount in the charging bin, obtain a second difference between the remaining feeding amount and the first feeding amount, and transmit the second difference to the control system. The control system is further configured to receive the second difference, and compare the second difference with the preset feeding amount to obtain a difference between the second difference and the preset feeding amount, in response to the difference between the second difference and the preset feeding amount being within a third preset threshold, control the feeding system to stop charging the single crystal furnace.

In some embodiments, the calibration system is communicatively connected with the control system, and the control system is further configured to generate a calibration instruction and transmit the calibration instruction to the calibration system in response to the difference between the second difference and the preset feeding amount being within the third preset threshold. The calibration system is configured to, in response to the calibration instruction, obtain an original remaining amount in the single crystal furnace and the second difference, and in response to a third difference between a sum of the original remaining amount and the second difference and the preset charging amount being within the second preset threshold, update the total charging amount in the single crystal furnace to the total charging weight, where the total charging weight is the sum of the original remaining amount and the second difference.

In some embodiments, the material preparation system includes a feeding machine, the feeding system includes a charging machine, and the single crystal furnace charging system further includes a transport system, configured to receive the charging request, and transport the charging machine to the feeding machine after a third preset time based on the charging request to obtain the materials prepared by the material preparation system, and transport the charging machine to the single crystal furnace after the materials prepared by the material preparation system are obtained by the feeding system, where the third preset time is shorter than both the first preset time and the second preset time. The single crystal furnace charging system further includes a grasping device, configured to grasp the materials prepared by the material preparation system into the charging machine after the first preset time in response to the charging request, the first preset time being longer than the third preset time and shorter than the second preset time.

Correspondingly, a charging method applied to the single crystal furnace charging system as described above is further provided according to the embodiments of the present disclosure, the charging method includes:

sending, by the control system, a charging request;

receiving, by a material preparation system, the charging request, preparing, by the material preparation system, materials based on the charging request;

receiving, by the feeding system, the charging request, obtaining, by the feeding system, the materials prepared by the material preparation system after a first preset time based on the charging request, and comparing, by the feeding system, an actual feeding amount with a preset charging amount to obtain a difference between the actual feeding amount and the preset charging amount, in response to the difference between the actual feeding amount and the preset charging amount being within the first preset threshold, charging a single crystal furnace based on the charging request after a second preset time; and obtaining, by the calibration system, a total charging weight in the single crystal furnace, and obtaining a difference between the total charging weight and a preset charging amount of the single crystal furnace, in response to the difference between the total charging weight and the preset charging amount of the single crystal furnace being within the second preset threshold, updating, by the calibration system, a total charging amount in the single crystal furnace to the total charging weight.

In some embodiments, the method of preparing a material includes: the materials include silicon material and dopant, and the charging method further includes: providing a material preparation system, where the material preparation system includes a first control unit and a feeding machine, the feeding machine includes a silicon material preparation box configured to store the silicon material of a preset weight, a dopant preparation device and a weight measure element; the silicon material preparation box is configured to store the silicon material of a preset weight, the dopant preparation device includes a storage box, the dopant is stored in the storage box, the storage box includes a discharge port, and the dopant is output to the silicon material preparation box through the discharge port; generating, by the first control unit, a preparation instruction in response to the charging request; and measuring, by the weight measure element, weight of a dopant to be output in response to the material preparation instruction, and in response to the weight of the dopant to be output being within a preset weight range, outputting the dopant to be output to the silicon material preparation box through the discharge port, and in response to the weight of the dopant to be output being not within the preset weight range, adjusting an amount of the dopant to be output, and remeasuring the weight of the dopant to be output until the weight of the dopant to be output fall within the preset weight range.

In some embodiments, obtaining, by the feeding system, the materials prepared by the material preparation system after a first preset time based on the charging request includes:

providing a feeding system and a transport system, where the feeding system includes a charging machine;

receiving, by the transport system, the charging request, transporting, by the transport system, to the feeding machine after a third preset time based on the charging request to obtain prepared materials, and transporting, by the transport system, the charging machine to the single crystal furnace after the prepared materials are obtained by the feeding system, where the third preset time is shorter than both the first preset time and the second preset time; and providing a grasping device, where the grasping device grasp the material prepared by the material preparation system into the charging machine after the first preset time in response to the charging request, and the first preset time being longer than the third preset time and shorter than the second preset time.

In some embodiments, comparing, by the feeding system, an actual feeding amount with a preset charging amount to obtain a difference between the actual feeding amount and the preset charging amount includes:

weighing, by a weighing unit, the materials in the charging bin and obtain a first feeding amount, which is the actual feeding amount;

receiving, by the comparing unit, the first feeding amount, and comparing, by the comparing unit, the first feeding amount with the preset feeding amount to obtain a first difference between the first feeding amount and the preset feeding amount; and receiving, by the determining unit, the first difference, and determining, by the determining unit, whether the first difference is within the first preset threshold or not.

In some embodiments, charging the single crystal furnace includes:

providing a feeding system and a transport system, where the feeding system includes a charging machine;

transporting, by the transport system, the charging machine to the single crystal furnace, and positioning the charging machine, to cause the charging machine to be connected to the single crystal furnace;

charging, by the charging machine, the single crystal furnace, and in response to the feeding system charging the single crystal furnace, performing, by a weighing unit, real-time detection on a remaining feeding amount in the charging bin, and obtaining, by the weighing unit, a second difference between the remaining feeding amount and the first feeding amount, and transmitting, by the weighing unit, the second difference to the control system; and receiving, by the control system, the second difference, and comparing, by the control system, the second difference with the preset feeding amount to obtain a difference between the second difference and the preset feeding amount, in response to the difference between the second difference and the preset feeding amount being within the third preset threshold, control the feeding system to stop charging the single crystal furnace.

In some embodiments, updating, by the calibration system, the total charging amount in the single crystal furnace to the total charging weight includes:

obtaining a remaining amount in the single crystal furnace before the single crystal furnace is charged by the charging machine;

obtaining the second difference after the single crystal furnace is charged by the charging machine; and providing a comparing device and a calibration system, obtaining, by the comparing device, an original remaining amount in the single crystal furnace and the second difference, and obtaining, by the comparing device, a third difference between a sum of the original remaining amount and the second difference and the preset charging amount, in response to the third difference between the sum of the original remaining amount and the second difference and the preset charging amount being within the second preset threshold, updating, by the calibration system, the total charging amount in the single crystal furnace to the total charging weight, where the total charging weight is the sum of the original remaining amount and the second difference.

The technical solutions provided according to the embodiments of the present disclosure have at least advantages as follows.

In the technical solutions of the single crystal furnace charging system provided according to the embodiments of the present disclosure, the control system is provided to perform charging control on the material preparation system, the feeding system, and the calibration system to achieve automatically material preparation. By providing the feeding system, not only the material prepared by the feeding system can be automatically obtained, but also the actual feeding amount can be compared with the preset feeding amount, so as to present the problem of excessive material amount in the single crystal furnace leading to silicon leakage or insufficient material amount in the single crystal furnace leading to low quality of crystal pulling after the single crystal furnace is fed caused by excessive or insufficient actual feeding amount in the single crystal furnace. By providing the calibration system, in response to the difference between the total charging weight and the preset charging amount being within the second preset threshold, the charging amount in the single crystal furnace is updated to the total charging weight by the calibration system. In this way, in response to an operator detecting an update in data, it is determined that the total charging weight in the single crystal furnace meets expectation and silicon leakage can be prevented. In addition, a charging request is received by the feeding system and the material preparation system synchronously, which start to work respectively after a preset time. In this way, communication between the feeding system and the material preparation system can be saved, so that a feeding time is saved and a charging efficiency is improved.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated.

FIG. 10 is a flow chart of operations of preparing, by the material preparation system, materials based on the charging request provided according to an embodiment of the present disclosure;

FIG. 11 is a flow chart of operations of obtaining, by the feeding system, the materials prepared by the material preparation system after the first preset time based on the charging request provided according to an embodiment of the present disclosure;

DETAILED DESCRIPTION

It is known from the background technology that there is a problem of low charging efficiency of the single crystal furnace.

Embodiments of the present disclosure provide a single crystal furnace charging system. A feeding system is provided, and the he feeding system is not only configured to automatically obtain materials prepared by the single crystal furnace charging system, but also compare an actual feeding amount with a preset feeding amount, to present the problem of too much or too little actual feeding amount that causes too much or too little material amount in the single crystal furnace after the single crystal furnace is fed. Further, a calibration system is provided. When a difference between a total charging weight and a preset charging amount is within a second preset threshold, the calibration system updates the charging amount in the single crystal furnace to the total charging weight. In this way, in response to an operator detecting an update in data, it is determined that the total charging weight in the single crystal furnace meets expectation and silicon leakage can be prevented. In addition, a charging request is received by the feeding system and the material preparation system synchronously, which start to work respectively after a preset time. In this way, communication between the feeding system and the material preparation system can be saved, so that the feeding time is saved and the charging efficiency is improved.

The embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
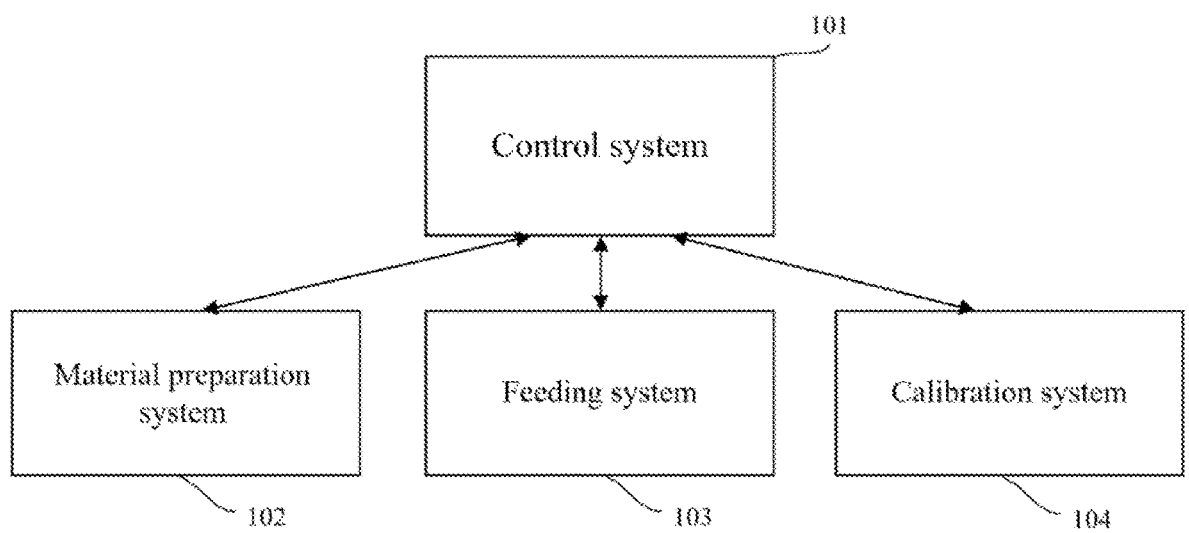
FIG. 1 is a function block diagram of a single crystal furnace charging system provided according to an embodiment of the present disclosure.

FIG. 1 is a function block diagram of a single crystal furnace charging system provided according to an embodiment of the present disclosure.

With reference to FIG. 1, the single crystal furnace charging system includes a control system 101 configured to send a charging request, a material preparation system 102 configured to receive the charging request and prepare materials based on the charging request, a feeding system 103 configured to receive the charging request, obtain the materials prepared by the material preparation system 102 after a first preset time t1 based on the charging request, and compare an actual feeding amount with a preset feeding amount to obtain a difference between the actual feeding amount and the preset charging amount, in response to the difference between the actual feeding amount and the preset feeding amount being within a first preset threshold, charge a single crystal furnace based on the charging request after a second preset time t2. The single crystal furnace charging system further includes a calibration system 104 configured to obtain a total charging weight in the single crystal furnace, and obtain a difference between the total charging weight and a preset charging amount of the single crystal furnace, in response to the difference between the total charging weight and a preset charging amount of the single crystal furnace being within a second preset threshold, update a total charging amount in the single crystal furnace to the total charging weight.

In some embodiments, the material preparation system 102, the feeding system 103 and the calibration system 104 are in communication connection with the control system 101.

The feeding system 103 is configured to compare the actual feeding amount with the preset feeding amount, so that the obtained feeding amount can be within the preset range to prevent the difference between the charging amount to the single crystal furnace and the preset value from being excessive. In addition, during the feeding system 103 charging the single crystal furnace, the calibration system 104 is configured to obtain a total charging weight in the single crystal furnace, and obtain a difference between the total charging weight and a preset charging amount of the single crystal furnace, in response to the difference between the total charging weight and the preset charging amount of the single crystal furnace being within the second preset threshold, update the total charging amount in the single crystal furnace to the total charging weight. In this way, in response to an operator detecting an update in data in the calibration system 104, it is determined that the total charging weight in the single crystal furnace meets expectation and silicon leakage can be prevented. In addition, a charging request is received by the feeding system 103 and the material preparation system 102 synchronously, and the control system 101 is configured to control the feeding system 103 and the material preparation system 102 to work respectively after a preset time. In this way, communication between the feeding system 103 and the material preparation system 102 can be saved, so that the feeding time is saved and the charging efficiency is improved, which further saves manual preparation, feeding and reviewing, and automatically charging is achieved.

In some embodiments, the control system 101 may be embodied as a single crystal silicon production management system storing information of a crucible in the single crystal furnace. It may be understood that the crucible in the single crystal furnace is configured to melt silicon material. Crucibles of varied sizes have varied capacities. In response to a volume of the silicon material in a crucible being greater than a capacity of the crucible, silicon leakage occurs. Therefore, the control system 101 is configured to store size information of the crucible and silicon material information corresponding to the crucible of the size. The silicon material information includes a weight of the silicon material and the number of dopants added to the silicon material. The dopants are mixed in the silicon material, so that prepared single crystal silicon is conductive or has a particular function.

In some embodiments, the control system 101 may be embodied as a manufacturing execution system (MES) or an enterprise resource planning administration (ERP).

Figure 2:
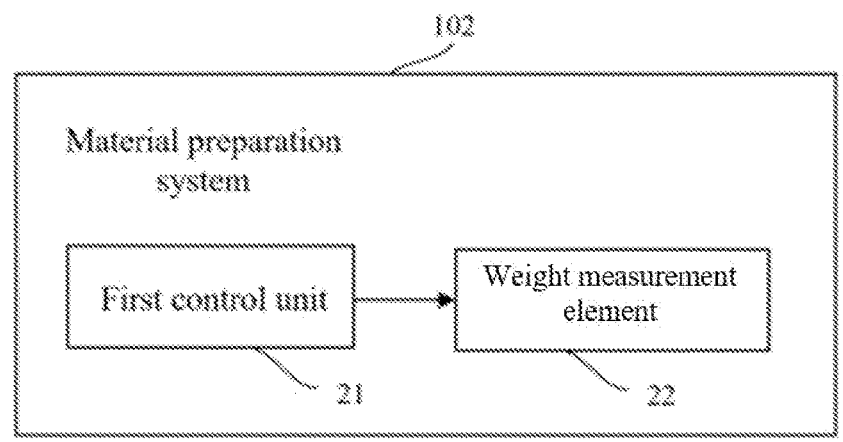
FIG. 2 is a function block diagram of a material preparation system provided according to an embodiment of the present disclosure.
Figure 3:
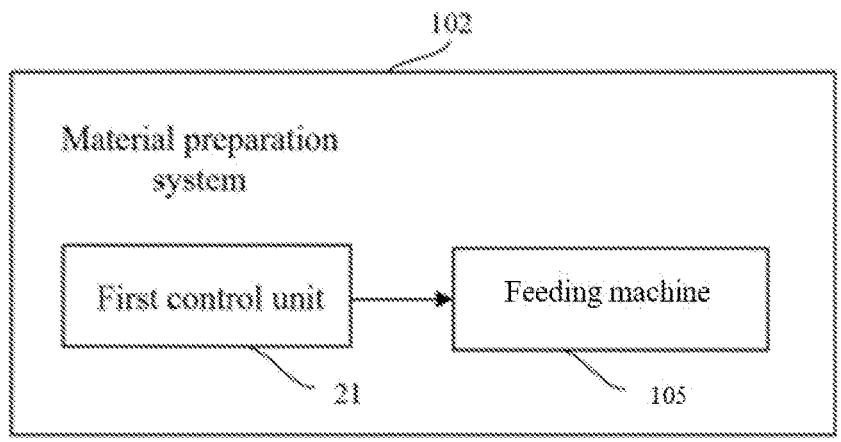
FIG. 3 is another function block diagram of the material preparation system provided according to an embodiment of the present disclosure.

With reference to FIG. 1, FIG. 2, and FIG. 3, in some embodiments, the materials include a silicon material and a dopant. The material preparation system 102 includes a first control unit 21 configured to generate a material preparation instruction in response to the charging request and a feeding machine 105. In some embodiments, in response to the charging request, the first control unit 21 is configured to obtain information of the crucible in the single crystal furnace and information of the silicon material corresponding to the information of the crucible. Herein, the information of the silicon material is a preset feeding amount, and a weight of the dopant corresponds to the preset feeding amount. In some embodiments, the dopant may be a mother alloy like an alloy of an impurity element with silicon. The impurity element may be a P-type impurity element or an N-type impurity element such as silicon boron or silicon phosphorus. Impurity elements with varied elements determine a conductive type of a prepared single crystal silicon. In this way, the prepared single crystal silicon prepared may be a P-type single crystal silicon or an N-type single crystal silicon.

Figure 4:
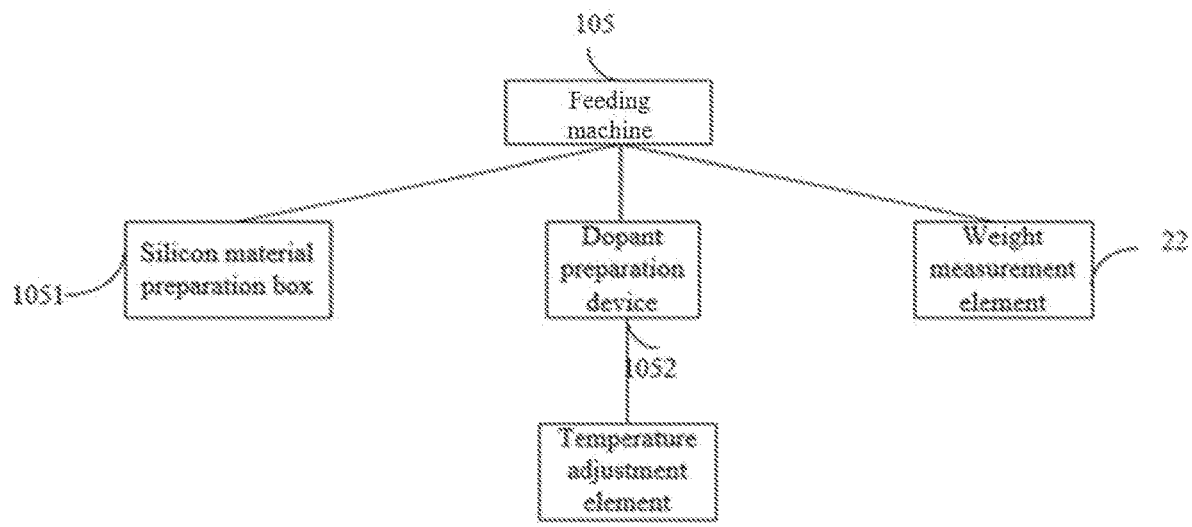
FIG. 4 is a block diagram of a feeding machine provided according to an embodiment of the present disclosure.
Figure 5:
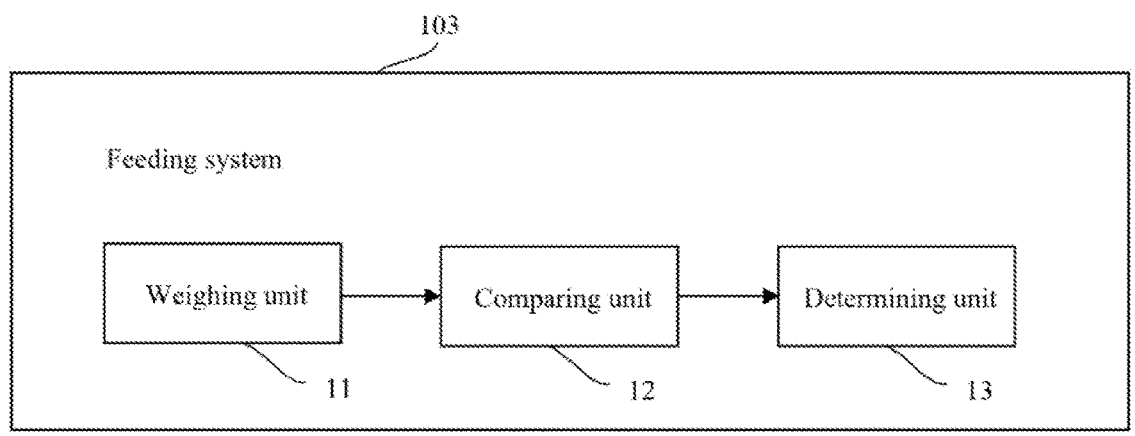
FIG. 5 is a block diagram of a feeding system provided according to an embodiment of the present disclosure.

According to FIG. 4, the feeding machine 105 is configured to store the materials, and the feeding machine 105 includes: a silicon material preparation box 1051 configured to store the silicon material of a preset weight. The feeding machine 105 further includes a dopant preparation device 1052 including a storage box, and the dopant is stored in the storage box, and the storage box includes a discharge port, and the dopant is output to the silicon material preparation box 1051 through the discharge port. The feeding machine 105 further includes a weight measure element 22 configured to measure a weight of a dopant to be output in response to the material preparation instruction, and in response to the weight of the dopant to be output being within a preset weight range, output the dopant to be output to the silicon material preparation box 1051 through the discharge port, and in response to the weight of the dopant to be output being not within the preset weight range, adjust an amount of the dopant to be output, and remeasure the weight of the dopant to be output until the weight of the dopant to be output fall within the preset weight range.

In some embodiments, there may be multiple silicon material preparation box 1051es. Varied silicon material preparation box 1051es may store varied types of silicon materials, and a weight of a silicon material in each silicon material preparation box 1051 is preset as a preset feeding amount. In this way, in response to the charging request, the material preparation system 102 only needs to select a corresponding silicon material preparation box 1051 according to material preparation information without weighing the silicon material in the silicon material preparation box 1051. Therefore, the material preparation time is saved.

In some embodiments, the dopant in the storage box is uniformly prepared as particles having a standard weight. In this way, in response to the dopant having a preset weight, the preset weight is divided by the standard weight to obtain the number of the particles of the dopant. Dopant particles of the corresponding number is output from the outlet. In this way, weighing of the dopant is simplified.

In some embodiments, the weight measure element 22 is in the storage box, for example, the weight measure element 22 may be located at a periphery of the discharge port. The weight measure element 22 is configured to weigh the dopant to be output from the discharge port in response to a material preparation instruction. In response to the weight of the dopant being within a preset weight range of the dopant corresponding to charging information, the dopant is output. In response to the weight of the dopant being beyond or does not achieve the preset weight range of the dopant corresponding to the charging information, the amount of the dopant to be output is reduced or the weight of the dopant to be output is increased. After that, the weight measure element 22 is configured to remeasure the amount of the dopant adjusted, until the weight of the dopant is within the preset weight range. In this way, proportion of the dopant and the silicon material may meet the expectation, so that performance of the single crystal silicon prepared is desirable.

In some embodiments, the weight measure element 22 may be embodied as a sensor unit. In some embodiments, the sensor unit is communicatively connected with the control system 101. The sensor unit is configured to obtain a weight data of the dopant, and feedback the weight data to the control system 101. The control system 101 is configured to compare the weight data with a preset weight of the dopant in the charging information to obtain the weight data of the dopant. In response to the weight data of the dopant being not within the preset weight range, the control system 101 is configured to send a first feedback information to the first control unit 21. The dopant preparation device 1052 is configured to adjust the weight of the dopant according to the first feedback information. The weight measure element 22 is configured to remeasure the weight of the dopant adjusted based on the first feedback information.

In some embodiments, the dopant preparation device 1052 further includes a temperature adjustment element configured to obtain temperature data in the storage box, and adjust the temperature in the storage box based on the temperature data, so that the temperature in the storage box is controlled within a preset temperature range. In this way, the storage box can be maintained as an environment with a constant temperature. This is advantageous for maintaining stable quality of the dopant and preventing the dopant from deteriorating.

Figure 6:
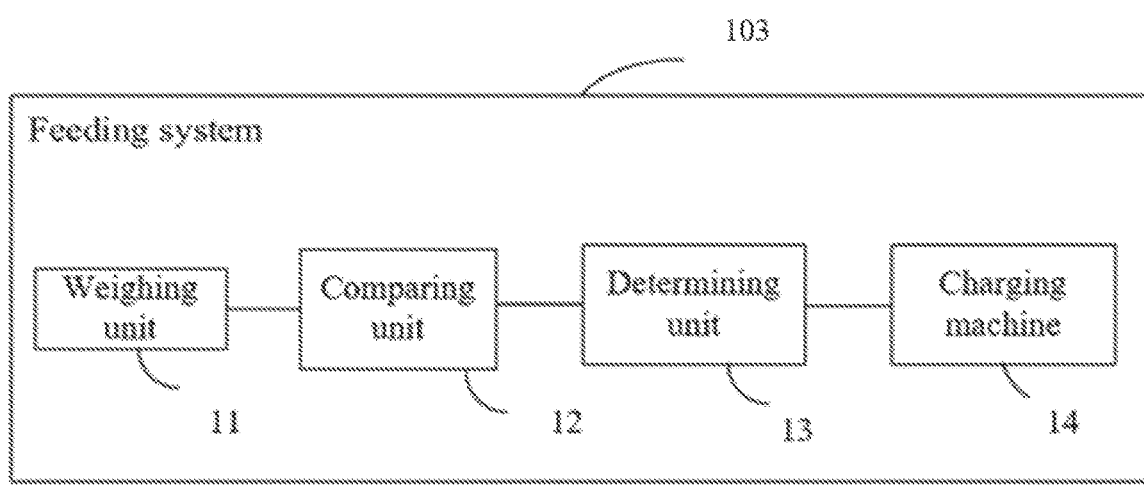
FIG. 6 is another block diagram of the feeding system provided according to an embodiment of the present disclosure.

With reference to FIG. 6, in some embodiments, the feeding system 103 includes a charging machine 14, where the charging machine 14 includes a charging bin, and the charging bin is configured to store the materials. The feeding system 103 further includes a weighing unit 11 configured to weigh the materials in the charging bin and obtain a first feeding amount, which is the actual feeding amount, a comparing unit 12 configured to receive the first feeding amount and compare the first feeding amount with the preset feeding amount to obtain a first difference between the first feeding amount and the preset feeding amount, and a determining unit 13 configured to receive the first difference and determine whether the first difference is within the first preset threshold or not, and in response to the first difference being within the first preset threshold, determine that it is time for the feeding system 103 to charge the single crystal furnace.

The feeding system 103 is configured to feed the material prepared by the material preparation system 102 into the charging bin. After the material is obtained, the feeding system 103 is configured to review the first feeding amount in the charging bin and the preset feeding amount to prevent the difference between the feeding amount and the preset feeding amount from being excessive caused by such problem as material falling during a process that the feeding system 103 obtaining the materials. In this way, the charging amount in the single crystal furnace can be not insufficient after the single crystal furnace is charged by the feeding system 103, to guarantee the quality of crystal pulling.

In some embodiments, the weighing unit 11 is arranged at the outside of the bottom of the charging bin. In this way, in response to the material being fed into the charging bin, the weighing unit 11 is configured to accurately sense a change in weight, so that the first feeding amount obtained can accurately reflect a weight of the actual feeding amount. In some embodiments, the weighing unit 11 may be embodied as a weighing sensor or another device for weighing.

The comparing unit 12 is communicatively connected with the weighing unit 11, and is configured to receive data of the first feeding amount obtained by the weighing unit 11. In some embodiments, the comparing unit 12 and the determining unit 13 are provided inside the control system 101. That is, the control system 101 is configured to obtain the first feeding amount, and compare the first feeding amount with the preset feeding amount corresponding to the charging information to obtain the first difference. In addition, the control system 101 is configured to determine whether the first difference is within the first preset threshold or not. It may be understood that range values of the first preset threshold and the second preset threshold may be set according to processing requirements. In response to the processing requirements being relatively high, the first preset threshold and the second preset threshold is set to a small number, for example, 0, to improve accuracy of the feeding amount. In response to the processing having to be expedited, the first preset threshold and the second preset threshold is set to a big number.

Figure 7:
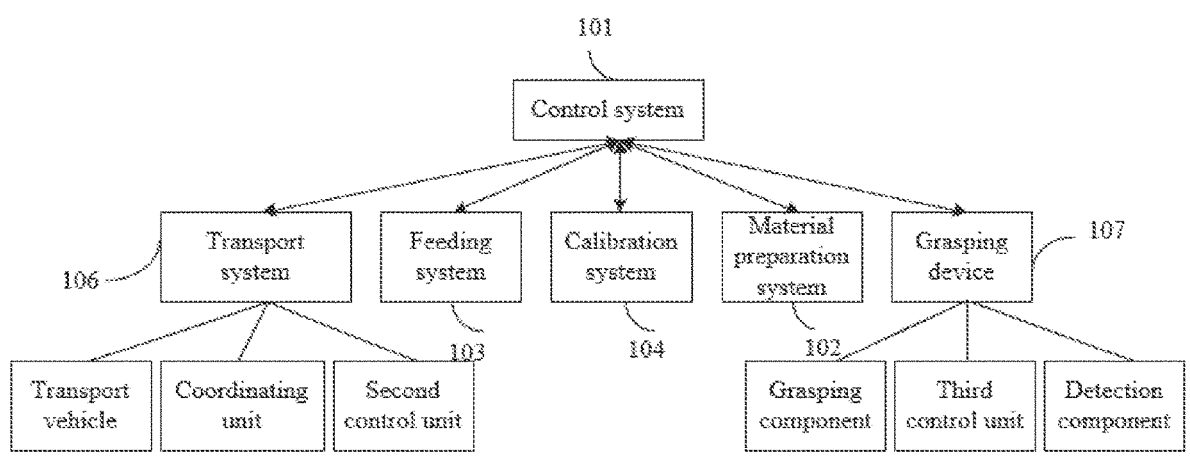
FIG. 7 is another block diagram of the single crystal furnace charging system provided according to an embodiment of the present disclosure.

According to FIG. 7, in some embodiments, the material preparation system 102 includes a feeding machine 105. The feeding system 103 includes a charging machine 14. The single crystal furnace charging system further includes a transport system 106 configured to receive the charging request, and transport the charging machine 14 to the feeding machine 105 after a third preset time t3 based on the charging request to obtain a prepared material. The transport system 106 is further configured to transport the charging machine 14 to the single crystal furnace after the feeding system 103 obtains the material. Herein, the third preset time t3 is shorter than both the first preset time t1 and the second preset time t2. By configuring that the transport system 106 automatically transports the charging machine 14 to the feeding machine 105 after the third preset time t3, a process of manually transporting the charging machine 14 is saved and full-automatic charging is achieved.

In other words, the control system 101 is configured to preset starting times of operation of the feeding system 103 and the transport system 106 in the charging request in advance. Specifically, in some embodiments, since the material preparation system 102 needs to prepare th materials first, the material preparation system 102 is configured to start preparation immediately after the charging request is received. The transport system 106 is configured to transport the charging machine 14 to the feeding machine 105 upon the third preset time t3 in response to the charging request. The feeding system 103 is configured to obtain the material prepared by the material preparation system 102 upon the first preset time t1. It may be understood that in order to improve management and control over time, the material preparation system 102 is configured as having to complete preparation within the first preset time t1. That is, the material preparation needs to be completed before the charging machine 14 is transported to the feeding machine 105, so that the charging machine 14 can obtain the material prepared as soon as arriving at the feeding machine 105, which saves waiting time of the charging machine 14. Upon the second preset time t2, the feeding system 103 is configured to charge the single crystal furnace. Herein, the second preset time t2 is longer than the first preset time t1. It may be understood that the feeding system 103 needs to complete obtaining the materials and reviewing the materials within a time difference between the second preset time t2 and the first preset time t1. The transport system 106 needs to transport the charging machine 14 to the single crystal furnace within the time difference between the second preset time t2 and the first preset time t1. In the single crystal furnace charging system provided according to the embodiments of the present disclosure, by presetting the first preset time t1, the second preset time t2 and the third preset time t3, and by setting that each system completes respective operations within present time periods, communication times between the systems can be reduced. In addition, by reasonably setting the times, waiting times of the systems can be saved, so that the systems operate constantly and operation efficiency is improved.

In some embodiments, the transport system 106 includes a transport vehicle to transport the charging machine 14, a coordinating unit configured to generate a transport instruction in response to the charging request, and a second control unit configured to receive the transport instruction and to control the transport vehicle to perform transportation in response to the transport instruction. Specifically, in some embodiments, the coordinating unit is configured to generate the transport instruction upon the third preset time t3 according to the charging request, so that the transport vehicle can transport the charging machine 14 to the feeding machine 105 upon the third preset time t3.

In some embodiments, the single crystal furnace charging system further includes a grasping device 107. The grasping device 107 includes a grasping component, a third control unit and a detection component. A detection identifier is provided at the outside of the silicon material preparation box 1051. Varied silicon material preparation box 1051*es* correspond to varied types of detection identifiers. The charging information of the charging request includes a type number of the silicon material preparation box 1051. Therefore, a type of the silicon material prescribed in the charging information is obtained in response to the detection identifier corresponding to the charging information being identified. The detection component is configured to identify the detection identifier based on the charging request, and obtain a first information of the detection identifier. The detection component is further configured to feedback the first information to the third control unit. The third control unit is configured to send a grasping instruction to the grasping component based on the first information. The grasping component is configured to grasp a silicon material preparation box 1051 corresponding to an identified detection identifier based on the grasping instruction, so that a feeding operation is completed.

In some embodiments, an information identifier including a type number of the silicon material in the silicon material preparation box 1051 is provided at the outside of the silicon material preparation box 1051. The detection component is further configured to identify the information identifier to obtain the type number of the silicon material in the silicon material preparation box 1051, to double check the type number of the silicon material in the silicon material preparation box 1051 to improve the accuracy of feeding.

In some embodiments, the grasping component may be embodied as either an intelligent mechanical arm or an intelligent robot. The detection component is provided inside the grasping component. The third control unit is provided inside the control system 101.

After the feeding system 103 completes obtaining of the material and reviewing the obtained feeding amount, the transport vehicle is configured to transport the charging machine 14 to the single crystal furnace and performs positioning on the charging machine 14 to complete communication between the charging machine 14 and the single crystal furnace. Specifically, in some embodiments, a first positioning sensor is installed at a communication port of the charging machine 14. A second positioning sensor is installed at a communication port of the single crystal furnace. The transport vehicle is configured to move to drive the charging machine 14 to move until the first positioning sensor senses the second positioning sensor and the communication is completed.

Figure 8:
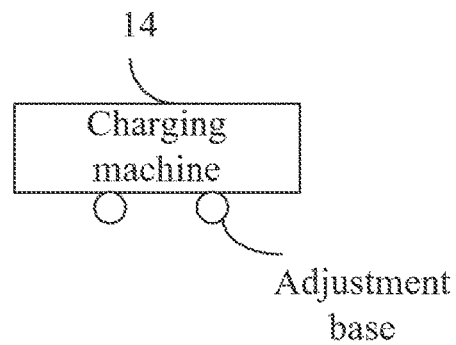
FIG. 8 is schematic view of a position relationship between a charging machine and an adjustment base provided according to an embodiment of the present disclosure.

According to FIG. 8, in some other embodiments, an adjustment base is installed at bottom of the charging machine 14. The adjustment base is configured to drive the charging machine 14 to move horizontally or vertically. In response to the transport vehicle transporting the charging machine 14 to a preset position, the adjustment base is configured to move horizontally or vertically to drive the charging machine 14 to move until the first positioning sensor senses the second positioning sensor and the communication is completed.

In some embodiments, the weighing unit 11 is further configured to, during a process that the feeding system 103 is charging the single crystal furnace, perform real-time detection on a remaining feeding amount in the charging bin, obtain a second difference between the remaining feeding amount and the first feeding amount, and transmit the second difference to the control system 101. The control system 101 is further configured to receive the second difference, and compare the second difference with the preset feeding amount to obtain a difference between the second difference and the preset feeding amount. In response to the difference between the second difference and the preset feeding amount being within a third preset threshold, the control system 101 is configured to control the feeding system 103 to stop charging the single crystal furnace.

It may be understood that during the process of the charging machine 14 charging the single crystal furnace, a difference between an original first feeding amount in the charging bin and the remaining feeding amount is a charging amount to the single crystal furnace. That is, the second difference is a charging amount to the single crystal furnace by the charging machine 14. Therefore, comparing the second difference with the preset feeding amount is practically comparing the charging amount to the single crystal furnace with the preset feeding amount. In response to the charging amount exceeding the preset feeding amount, silicon leakage occurs in the single crystal furnace. Therefore, during the process of charging the single crystal furnace, the charging amount to the single crystal furnace is detected in a real time. In this way, in response to the charging amount reaching the preset feeding amount, the charging operation is performed in time to reduce or prevent occurrence of silicon leakage.

In the embodiments of the present disclosure, by reviewing the material amount and the preset feeding amount at communication ports of the varied systems (after the feeding machine 105 feeds the charging machine 14 and during the process that the charging machine 14 is charging the single crystal furnace), an actual amount can be within the preset feeding amount, which not only prevents silicon leakage, but also guarantees the quality of crystal pulling.

In some embodiments, the third preset threshold is set according to process requirements of crystal pulling.

In some embodiments, the calibration system 104 is communicatively connected with the control system 101, and the control system 101 is further configured to generate a calibration instruction and transmit the calibration instruction to the calibration system 104 in response to the difference between the second difference and the preset feeding amount being within the third preset threshold. The calibration system 104 is configured to, in response to the calibration instruction, obtain an original remaining amount in the single crystal furnace and the second difference, and in response to a third difference between a sum of the original remaining amount and the second difference and the preset charging amount being within the second preset threshold, update the total charging amount in the single crystal furnace to the total charging weight, where the total charging weight is the sum of the original remaining amount and the second difference.

It may be understood that the preset charging amount is a maximum material amount acceptable by the crucible in the single crystal furnace. Once the material amount in the crucible exceeds the preset charging amount, silicon leakage occurs. In a practical production process, after crystal pulling is performed to generate single crystal silicon in the single crystal furnace, there would be some silicon material left unused. A weight of the unused silicon material is recorded as a remaining material amount. After the single crystal furnace is charged by the charging machine 14, a total material amount in the crucible in the single crystal furnace is a sum of the second difference (i.e., a charging amount of the charging machine 14 to the single crystal furnace) and the remaining material amount in the single crystal furnace. Therefore, in response to the calibration instruction, the calibration system 104 is configured to obtain a sum of the second difference and the remaining material amount to reflect a real material amount in the crucible in the single crystal furnace. After that, the actual material amount in the crucible in the single crystal furnace is compared with the preset charging amount, so that it may be determined whether there is the risk of silicon leakage based on the real feeding amount in the crucible in the single crystal furnace. In response to the third difference between the sum of the second difference and the remaining material amount and the preset charging amount being within the second preset threshold, the calibration system 104 is configured to update an actual weight in the single crystal furnace to the sum of the second difference and the remaining material amount. An operator does not start pulling until seeing the update done by the calibration system 104. In response to the third difference being not within the second preset threshold, the calibration system 104 does not update the actual weight, and the operator would not start pulling, which can prevent silicon leakage from occurring to a maximum extent. In some embodiments, obtaining a remaining material amount include weighing single crystal silicon generated after crystal pulling is performed in the single crystal furnace. A total charging weight updated by the calibration system 104 before the crystal pulling is performed subtracting the weight of the single crystal silicon results in the remaining material amount in the single crystal furnace.

In the single crystal furnace charging system provided according to the embodiments of the present disclosure, The feeding system 103 is configured to compare the actual feeding amount with the preset feeding amount, so that the obtained feeding amount can be within the preset range to prevent the difference between the charging amount to the single crystal furnace and the preset value from being excessive. In addition, during the feeding system 103 charging the single crystal furnace, the calibration system 104 is configured to obtain a total charging weight in the single crystal furnace, and obtain a difference between the total charging weight and a preset charging amount of the single crystal furnace, in response to the difference between the total charging weight and the preset charging amount of the single crystal furnace being within the second preset threshold, update the total charging amount in the single crystal furnace to the total charging weight. In this way, in response to an operator detecting an update in data in the calibration system 104, it is determined that the total charging weight in the single crystal furnace meets expectation and silicon leakage can be prevented. In addition, a charging request is received by the feeding system 103 and the material preparation system 102 synchronously, and the control system 101 is configured to control the feeding system 103 and the material preparation system 102 to work respectively after a preset time. In this way, communication between the feeding system 103 and the material preparation system 102 can be saved, so that the feeding time is saved and the charging efficiency is improved, which further saves manual preparation, feeding and reviewing, and automatically charging is achieved.

Correspondingly, a charging method applied to the single crystal furnace charging system provided according to the above embodiments is further provided according to the embodiments of the present disclosure, and the charging method is described with reference to the accompanying drawings.

Figure 9:
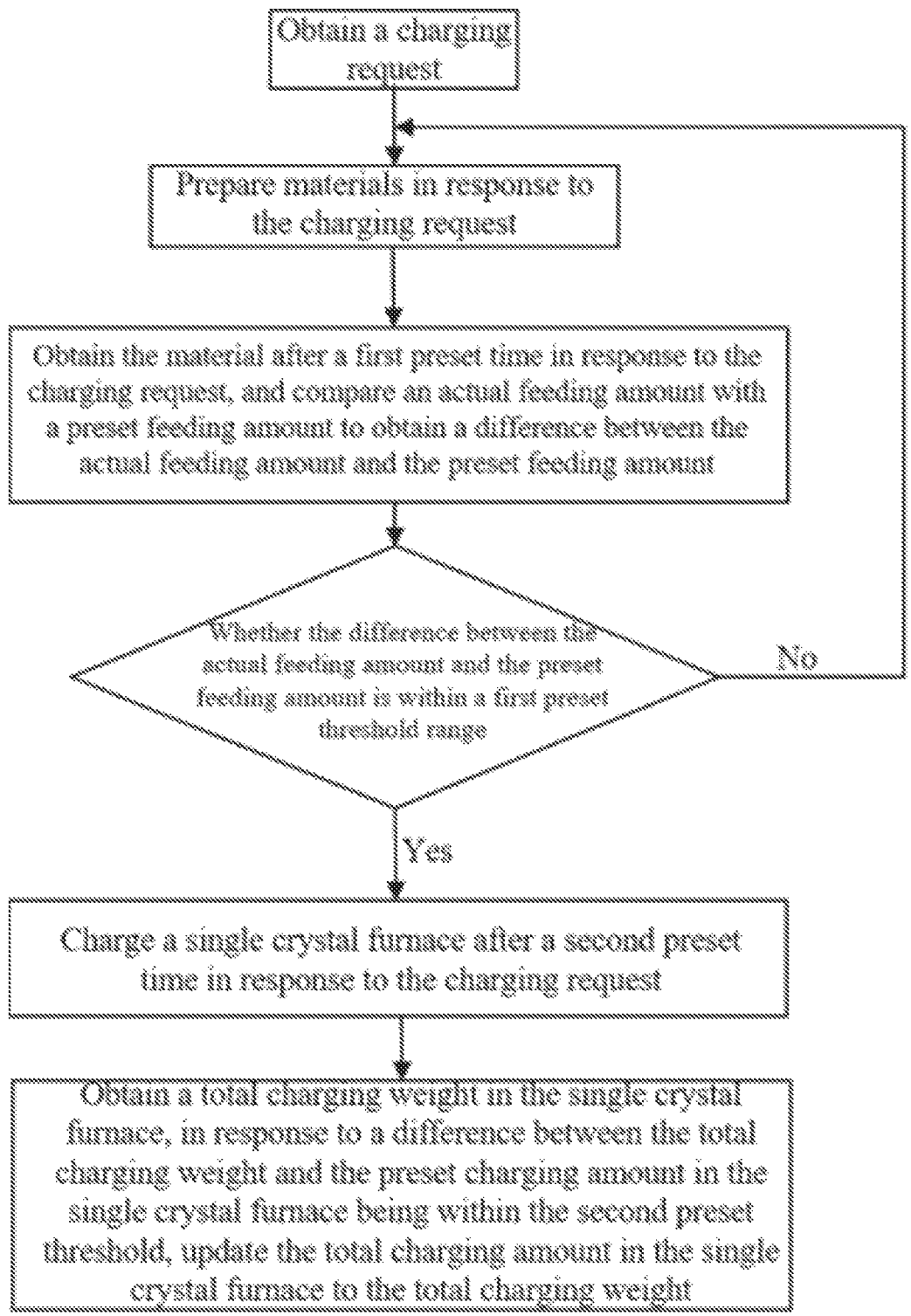
FIG. 9 is a flow chart of a charging method provided according to an embodiment of the present disclosure.

With reference to FIG. 9, the charging method includes the following operations.

In an operation, a charging request is sent by a control system, and the charging request is received by a material preparation system 102, and materials are prepared by the material preparation system 102 based on the charging request. In some embodiments, the charging request is sent by the control system 101. The control system 101 is configured to store size information of the crucible and silicon material information corresponding to the crucible of the size. The silicon material information includes a weight of the silicon material and the number of the dopants added to the silicon material. In some embodiments, the control system 101 may be embodied as a MES or an ERP.

In an operation, materials are prepared in response to the charging request.

According to FIG. 10, in some embodiments, preparing the materials includes the following operations. In an operation, a material preparation system 102 is provided, where the material preparation system 102 includes a first control unit 21 and a feeding machine 105, the feeding machine 105 includes a silicon material preparation box 1051 configured to store the silicon material of a preset weight. The first control unit 21 is configured to generate material preparation instruction in response to the charging request. In some embodiments, the first control unit 21 is configured to obtain a crucible information and silicon material information corresponding to the crucible information in the single crystal furnace in response to the charging request. The silicon material information is a preset feeding amount, and a weight of the dopant corresponds to the preset feeding amount.

In response to the material preparation instruction, the dopant preparation device 1052 is configured to measure the weight of the dopant to be output. In response to the weight of the dopant to be output being within a preset weight range, the dopant preparation device 1052 is configured to output the dopant to be output to the silicon material preparation box 1051. In response to the weight of the dopant to be output being not within the preset weight range, the amount of the dopant to be output is adjusted, and the weight of the dopant to be output is remeasured until the weight of the dopant to be output is within the preset weight range.

In some embodiments, there may be multiple silicon material preparation box 1051es. Varied silicon material preparation box 1051es may store varied types of silicon materials, and a weight of a silicon material in each silicon material preparation box 1051 is preset as a preset feeding amount. In some embodiments, the dopant in the storage box is uniformly prepared as particles having a standard weight. In this way, in response to the dopant of a preset weight being required, the weight of the dopant can be converted into the number of the dopant, and the dopant of the corresponding number is output.

In some embodiments, the weight measure element 22 may be embodied as a sensor unit. In some embodiments, the sensor unit is communicatively connected with the control system 101. The sensor unit is configured to obtain a weight data of the dopant, and feedback the weight data to the control system 101. The control system 101 is configured to compare the weight data with a preset weight of the dopant in the charging information to obtain the weight data of the dopant. In response to the weight data of the dopant being not within the preset weight range, the control system 101 is configured to send a first feedback information to the first control unit 21. The dopant preparation device 1052 is configured to adjust the weight of the dopant according to the first feedback information. The weight measure element 22 is configured to remeasure the weight of the dopant adjusted based on the first feedback information.

After the material preparation is completed, the prepared materials are obtained after a first preset time t1 in response to the charging request, and an obtained actual feeding amount is compared with a preset feeding amount. In response to a difference between the actual feeding amount and the preset feeding amount being within a first preset threshold, the single crystal furnace is charged after a second preset time t2 based on the charging request. After the materials are obtained, the first feeding amount in the charging bin and the preset feeding amount are reviewed to prevent a difference between the feeding amount and the preset feeding amount being excessive caused by such problem as material falling during a process that the feeding system 103 obtaining the materials. In this way, the charging amount in the single crystal furnace can be not insufficient after the single crystal furnace is charged by the feeding system 103, to guarantee the quality of crystal pulling.

Figure 12:
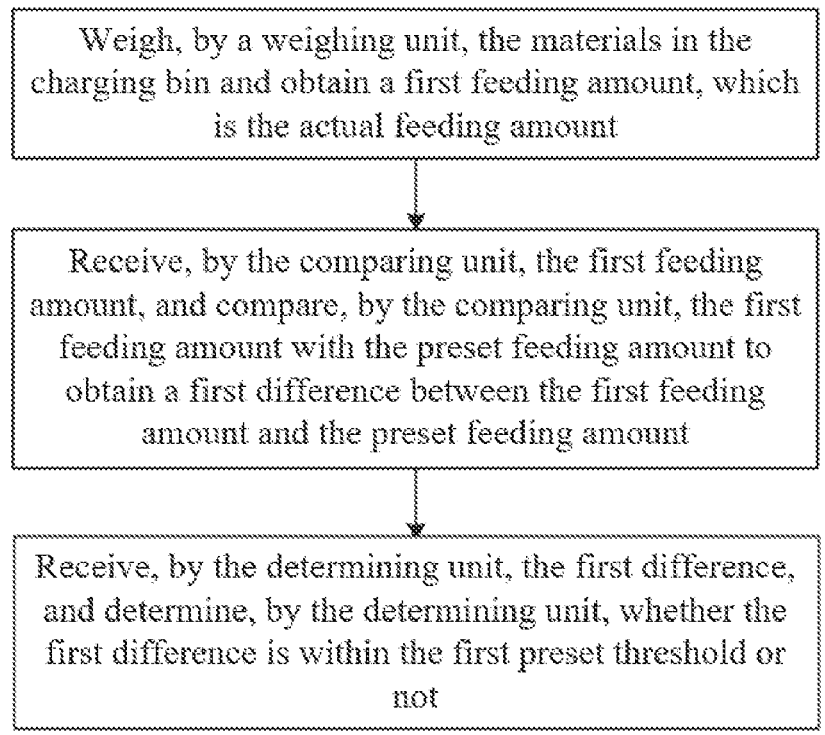
FIG. 12 is a flow chart of operations of comparing, by the control system, an actual feeding amount with a preset charging amount to obtain the difference between the actual feeding amount and the preset charging amount provided according to an embodiment of the present disclosure.

According to FIG. 12, in some embodiments, comparing, by the feeding system 103, an actual feeding amount with a preset charging amount to obtain a difference between the actual feeding amount and the preset charging amount includes the following operations. In an operation, the materials are weighed by the weighing unit 11 in the charging bin to obtain a first feeding amount, which is the actual feeding amount. In an operation, the first feeding amount is received by the comparing unit 12, and the first feeding amount is compared by the comparing unit 12 with the preset feeding amount to obtain a first difference between the first feeding amount and the preset feeding amount. In an operation, and the first difference is received by the determining unit 13, and whether the first difference is within the first preset threshold or not is determined by the determining unit 13. Specifically, in some embodiments, the materials in the charging bin are weighed by the weighing unit 11. The weighing unit 11 may be embodied as a weighing sensor or another device for weighing. The weighing unit 11 is communicatively connected with the control system 101, and is configured to transmit the first feeding amount to the control system 101. The control system 101 is configured to obtain the first feeding amount, and compare the first feeding amount with the preset feeding amount corresponding to the charging information to obtain the first difference. After that, the control system is configured to determine whether the first difference is within the first preset threshold.

With reference to FIG. 11, obtaining, by the feeding system 103, the materials prepared by the material preparation system 102 after a first preset time t1 based on the charging request includes the following operations.

In an operation, a feeding system and a transport system 106 are provided, where the feeding system includes a charging machine 14. The charging request is received by the transport system 106, the charging machine 14 is transported to the feeding machine 105 after a third preset time t3 based on the charging request to obtain prepared materials, and the charging machine 14 is transported to the single crystal furnace after the prepared materials are obtained by the feeding system 103, where the third preset time t3 is shorter than both the first preset time t1 and the second preset time t2. By configuring that the transport system 106 automatically transports the charging machine 14 to the feeding machine 105 after the third preset time t3, a process of manually transporting the charging machine 14 is saved and full-automatic charging is achieved. In some embodiments, the transport system 106 includes a transport vehicle and a coordinating unit. The coordinating unit is configured to generate a transport instruction at the third preset time t3 in response to the charging request, so that the transport vehicle transports the charging machine 14 to the feeding machine 105 upon the third preset time t3.

In an operation, a grasping device 107 is provided, where the grasping device 107 is configured to grasp the materials prepared by the material preparation system 102 into the charging machine 14 after the first preset time t1 in response to the charging request, and the first preset time t1 being longer than the third preset time t3 and shorter than the second preset time t2.

In other words, the control system 101 is configured to preset starting times of operation of the feeding system 103, the transport system 106 and the grasping device 107 in the charging request in advance. Specifically, in some embodiments, the material preparation system 102 is configured to start preparation immediately after the charging request is received. The transport system 106 is configured to transport the charging machine 14 to the feeding machine 105 upon the third preset time t3 in response to the charging request. The grasping device 107 is configured to grasp the materials prepared by the material preparation system 102 to the charging machine 14 upon the first preset time t1. It should be noted that the transport system 106 needs to transport the charging machine 14 to the single crystal furnace within the time difference between the second preset time t2 and the first preset time t1. In some embodiments, the time for the transport system 106 transporting the charging machine 14 to the material preparation system 102 is set exactly equal to the time difference between the third preset time t3 and the first preset time t1, which saves waiting time of the grasping device 107, so that the time allocation is more reasonable, thereby improving the charging efficiency. The feeding system 103 is configured to obtain the material prepared by the material preparation system 102 upon the first preset time t1. It may be understood that in order to improve management and control over time, the material preparation system 102 is configured as having to complete preparation within the first preset time t1, and the feeding system 103 is configured to charge the single crystal furnace upon the second preset time t2, where the second preset time t2 is longer than the first preset time t1. The feeding system 103 needs to complete obtaining the materials and reviewing the materials within a time difference between the second preset time t2 and the first preset time t1, and the transport system 106 needs to transport the charging machine 14 to the single crystal furnace within the time difference between the second preset time t2 and the first preset time t1.

In some embodiments, the grasping device 107 includes a grasping component, a third control unit and a detection component. A detection identifier is provided at the outside of the silicon material preparation box 1051. The detection component is configured to identify the detection identifier based on the charging request, and obtain a first information of the detection identifier. The detection component is further configured to feedback the first information to the third control unit. The third control unit is configured to send a grasping instruction to the grasping component based on the first information. The grasping component is configured to grasp a silicon material preparation box 1051 corresponding to an identified detection identifier based on the grasping instruction, so that a feeding operation is completed.

Figure 15:
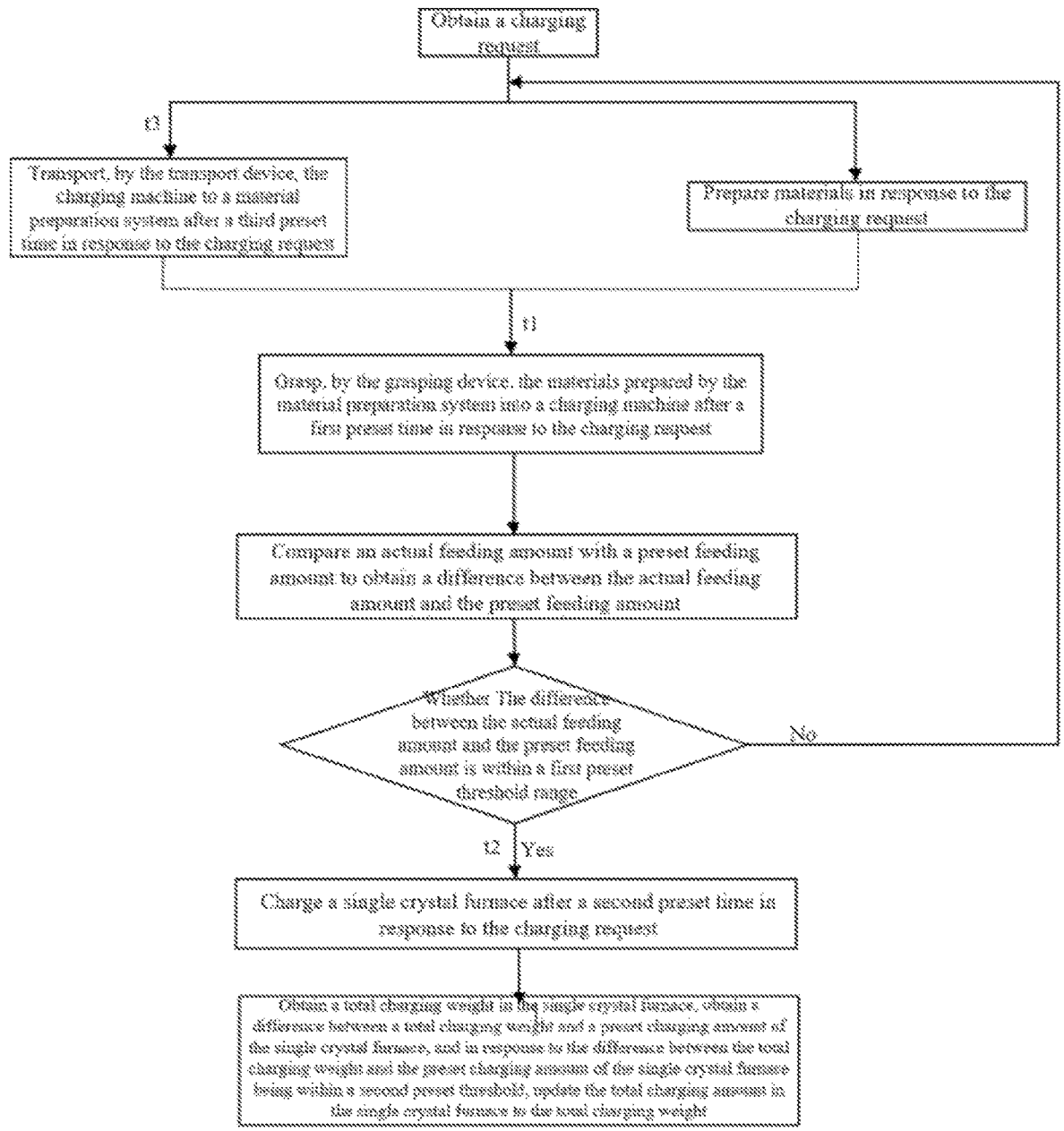
FIG. 15 is another flow chart of the charging method provided according to an embodiment of the present disclosure.

With reference to FIG. 15, in some embodiments, in response to the difference between the actual feeding amount and the preset feeding amount being not within the first preset threshold, the material preparation system 102 is configured to prepare material again and repeat the following process until the difference between the actual feeding amount and the preset feeding amount is within the first preset threshold.

In some embodiments, an information identifier including a type number of the silicon material in the silicon material preparation box 1051 is provided on the outside of the silicon material preparation box 1051. The detection component is further configured to identify the information identifier to obtain the type number of the silicon material in the silicon material preparation box 1051, to double check the type number of the silicon material in the silicon material preparation box 1051 to improve the accuracy of feeding.

In some embodiments, the grasping component may be embodied as either an intelligent mechanical arm or an intelligent robot. The detection component is provided inside the grasping component. The third control unit is provided inside the control system 101.

Figure 13:
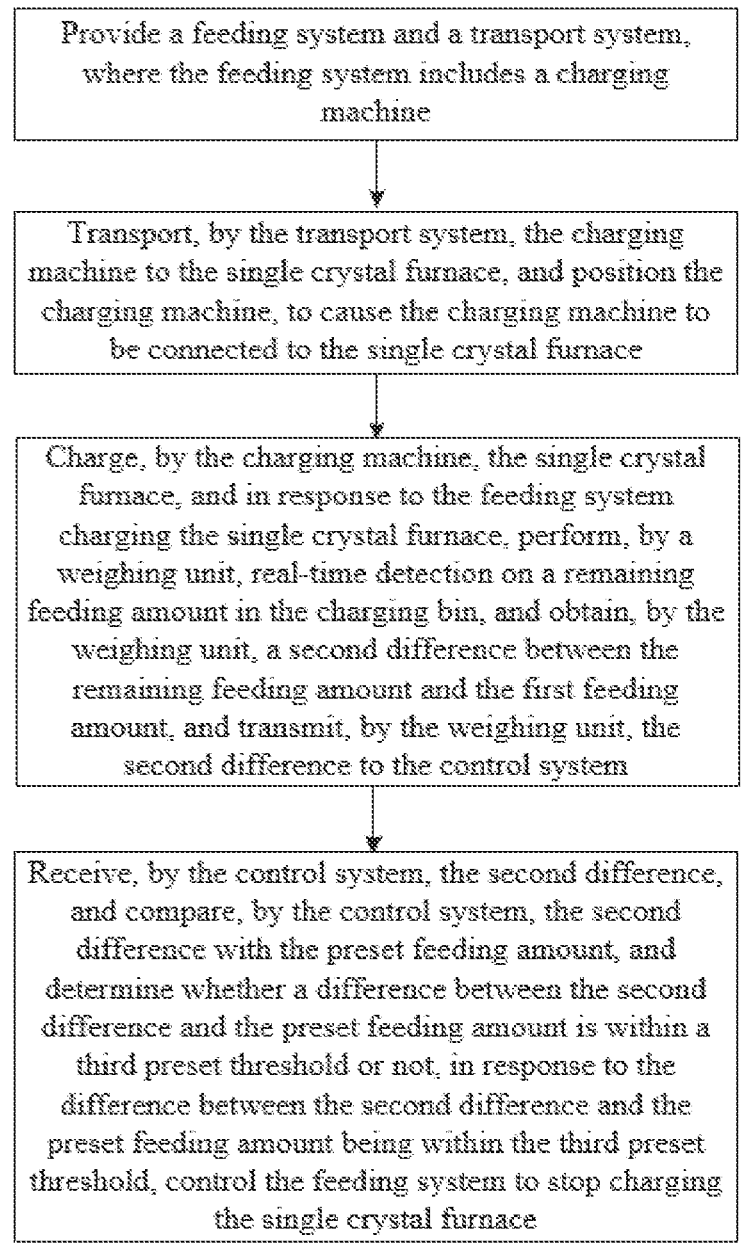
FIG. 13 is a flow chart of operations of charging the single crystal furnace provided according to an embodiment of the present disclosure.

According to FIG. 13, in some embodiments, charging the single crystal furnace includes the following operations.

In an operation, a feeding system 103 and a transport system 106 are provided, where the feeding system 103 includes a charging machine 14.

In an operation, the charging machine 14 is transported by the transport system 106 to the single crystal furnace, and the charging machine 14 is positioned to cause the charging machine 14 to be connected to the single crystal furnace machine. Specifically, after the materials is obtained by the feeding system 103, and the obtained feeding amount is reviewed, the transport vehicle transports the charging machine 14 to the single crystal furnace and performs positioning on the charging machine 14 to complete connection between the charging machine 14 and the single crystal furnace.

In an operation, the single crystal furnace is charged by the charging machine 14, and in response to the feeding system 103 charging the single crystal furnace, a real-time detection is performed by the weighing unit 11 on a remaining feeding amount in the charging bin, and a second difference between the remaining feeding amount and the first feeding amount is obtained by the weighing unit 11, and the second difference is transmitted by the weighing unit 11 to the control system 101. Specifically, after the connection between the charging machine 14 and the single crystal furnace is completed, the charging machine 14 is configured to charge the single crystal furnace. During charging, a remaining feeding amount in the charging machine 14 is monitored during the charging in real time. A second difference between the remaining feeding amount and an initial feeding amount in the charging machine 14 is obtained. The second difference is compared with the preset feeding amount. In response to the difference between the second difference and the preset feeding amount being within the third preset threshold, charging to the single crystal furnace is stopped. The second difference is a charging amount to the single crystal furnace by the charging machine 14. During the process of charging the single crystal furnace, the charging amount to the single crystal furnace is detected in real time. In this way, in response to the charging amount reaching the preset feeding amount, the charging operation is performed in time to reduce or prevent occurrence of silicon leakage.

In an operation, the second difference is received by the control system 101, and the second difference is compared by the control system 101 with the preset feeding amount to obtain a difference between the second difference and the preset feeding amount, in response to the difference between the second difference and the preset feeding amount being within the third preset threshold, the feeding system 103 is controlled to stop charging the single crystal furnace After the single crystal furnace is charged by the charging machine 14 charges, a total charging weight in the single crystal furnace is obtained. In response to a difference between the total charging weight and the preset charging amount in the single crystal furnace being within the second preset threshold, the total charging amount in the single crystal furnace is updated to the total charging weight. The preset charging amount is a maximum material capacity of the crucible in the single crystal furnace. Once the material amount in the crucible exceeds the preset charging amount, silicon leakage occurs. Therefore, in response to the calibration instruction, the calibration system 104 is configured to obtain a sum of the second difference and the remaining material amount to reflect a real material amount in the crucible in the single crystal furnace. Then the actual material amount in the crucible in the single crystal furnace is compared with the preset charging amount, to determine whether there is the risk of silicon leakage based on the real charging amount in the crucible in the single crystal furnace or not.

Figure 14:
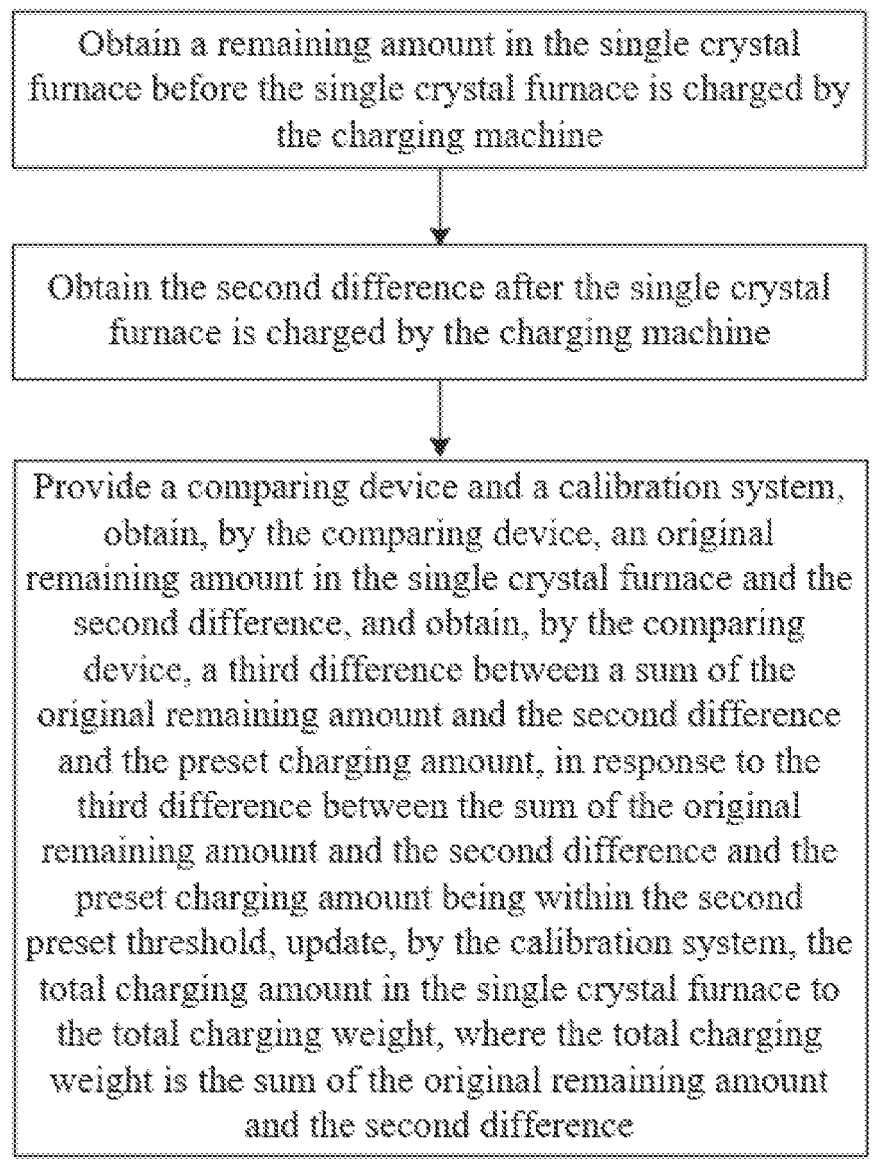
FIG. 14 is a flow chart of operations of updating, by the calibration system, the total charging amount in the single crystal furnace to the total charging weight provided according to an embodiment of the present disclosure.

According to FIG. 14, in some embodiments, updating, by the calibration system 104, the total charging amount in the single crystal furnace to the total charging weight includes the following operations.

In an operation, a remaining amount in the single crystal furnace is obtained before the single crystal furnace is charged by the charging machine 14. In some embodiments, obtaining a remaining material amount includes weighing single crystal silicon generated after the crystal pulling is performed in the single crystal furnace. A total charging weight updated by the calibration system 104 before the crystal pulling is performed subtracting the weight of the single crystal silicon results in the remaining material amount in the single crystal furnace.

In an operation, the second difference is obtained after the single crystal furnace is charged by the charging machine 14. In some embodiments, the real-time detection is performed on a remaining feeding amount in the charging machine 14 by the weighing device provided on the bottom of the charging machine 14 to obtain a difference between the first feeding amount and the remaining feeding amount.

In an operation, a comparing device, and a calibration system 104 are provided, an original remaining amount in the single crystal furnace and the second difference are obtained by the comparing device, and a third difference between a sum of the original remaining amount and the second difference and the preset charging amount is obtained by the comparing device. In response to the third difference between the sum of the original remaining amount and the second difference and the preset charging amount being within the second preset threshold, the total charging amount in the single crystal furnace is updated to the total charging weight by the calibration system 104, where the total charging weight is the sum of the original remaining amount and the second difference. In some embodiments, the comparing device is the control system 101. In some embodiments, after the sum of the remaining amount in the single crystal furnace is obtained, the data of the remaining amount is transmitted to the control system 101 and the second difference is obtained, and the second difference is transmitted to the control system 101. The control system 101 is configured to receive the remaining amount and the second difference, obtain the sum of the remaining amount and the second difference, compare the sum with the preset charging amount corresponding with the charging information to obtain the third difference, and determine whether the third difference is within the second preset threshold or not. In response to the third difference being within the second preset threshold, the control system 101 is configured to transmit the data of the sum of the second difference and the remaining amount to the calibration system 104. The calibration system 104 is configured to update the total charging amount in the single crystal furnace to the total charging weight.

In the charging method provided according to the above embodiments, the actual feeding amount is compared with the preset feeding amount, so that the obtained feeding amount can be within the preset range to prevent the difference between the charging amount to the single crystal furnace and the preset value from being excessive. In addition, during charging the single crystal furnace, the total charging weight in the single crystal furnace is obtained, and the difference between the total charging weight and a preset charging amount of the single crystal furnace is obtained. In response to the difference between the total charging weight and the preset charging amount of the single crystal furnace being within the second preset threshold, the total charging amount in the single crystal furnace is updated to the total charging weight. In this way, in response to an operator detecting an update in data in the calibration system 104, it is determined that the total charging weight in the single crystal furnace meets expectation and silicon leakage can be prevented.

Those of ordinary skill in the art can understand that the above embodiments are specific examples for realizing the present disclosure. In practice, however, many changes can be made in the forms and details of the specific embodiments without departing from the spirit and scope of the present disclosure. Any one of those skilled in the art may perform respective change and amendment within a scope not departing from the spirit and scope of the present disclosure. Therefore, the protection scope of the present disclosure should be subject to the scope defined by the claims.

What is claimed is:

1. A single crystal furnace charging system, comprising:
a control system, configured to send a charging request;
a material preparation system, configured to receive the charging request and prepare materials based on the charging request;
a feeding system, including a comparing unit and a charging machine; wherein the feeding system is configured to receive the charging request, obtain the materials prepared by the material preparation system after a first preset time based on the charging request, the comparing unit is configured to compare an actual feeding amount with a preset feeding amount to obtain a difference between the actual feeding amount and the preset feeding amount, and the charging machine is configured to, in response to the difference between the actual feeding amount and the preset feeding amount being within a first preset threshold, charge a single crystal furnace based on the charging request after a second preset time; and
a calibration system, configured to obtain a total charging weight in the single crystal furnace, obtain a difference between the total charging weight and the preset feeding amount of the single crystal furnace, and, in response to the difference between the total charging weight and the preset feeding amount of the single crystal furnace being within a second preset threshold, update a total charging amount in the single crystal furnace to the total charging weight;

wherein the materials include silicon material and a dopant, and the material preparation system includes:

a first control unit, configured to generate a material preparation instruction in response to the charging request;

a feeding machine, configured to store the materials, wherein the feeding machine includes:

a silicon material preparation box, configured to store the silicon material of a preset weight;

a dopant preparation device, including a storage box, wherein the dopant is stored in the storage box, the storage box includes a discharge port, and the dopant is output to the silicon material preparation box through the discharge port; and a weight measurement element, configured to measure a weight of a dopant to be output in response to the material preparation instruction;

wherein, in response to the weight of the dopant to be output being within a preset weight range, the weight measurement element is further configured to output the dopant to be output to the silicon material preparation box through the discharge port, and wherein, in response to the weight of the dopant to be output being not within the preset weight range, the weight measurement element is further configured to adjust an amount of the dopant to be output and remeasure the weight of the dopant to be output, until the weight of the dopant to be output falls within the preset weight range.

2. The single crystal furnace charging system according to claim 1, wherein the feeding system further includes a weighing unit and a determining unit, wherein:

the charging machine includes a charging bin configured to store the materials;

the weighing unit is configured to weigh the materials in the charging bin and obtain a first feeding amount, which is the actual feeding amount;

the comparing unit is configured to receive the first feeding amount and compare the first feeding amount with the preset feeding amount to obtain a first difference between the first feeding amount and the preset feeding amount; and the determining unit is configured to receive the first difference and determine whether the first difference is within the first preset threshold, and in response to the first difference being within the first preset threshold, determine that it is time for the feeding system to charge the single crystal furnace.

3. The single crystal furnace charging system according to claim 2, wherein the weighing unit is further configured to, in response to the feeding system charging the single crystal furnace, perform real-time detection on a remaining feeding amount in the charging bin, obtain a second difference between the remaining feeding amount and the first feeding amount, and transmit the second difference to the control system; and the control system is further configured to receive the second difference, and compare the second difference with the preset feeding amount to obtain a difference between the second difference and the preset feeding amount, in response to the difference between the second difference and the preset feeding amount being within a third preset threshold, control the feeding system to stop charging the single crystal furnace.

4. The single crystal furnace charging system according to claim 3, wherein the calibration system is communicatively connected with the control system, and the control system is further configured to generate a calibration instruction and transmit the calibration instruction to the calibration system in response to the difference between the second difference and the preset feeding amount being within the third preset threshold; and the calibration system is configured to, in response to the calibration instruction, obtain an original remaining amount in the single crystal furnace and the second difference, and in response to a third difference between a sum of the original remaining amount and the second difference and the preset feeding amount being within the second preset threshold, update the total charging amount in the single crystal furnace to the total charging weight, wherein the total charging weight is the sum of the original remaining amount and the second difference.

5. The single crystal furnace charging system according to claim 1, wherein the single crystal furnace charging system further includes:

a transport system, configured to receive the charging request, and transport the charging machine to the feeding machine after a third preset time based on the charging request to obtain the materials prepared by the material preparation system, and transport the charging machine to the single crystal furnace after the materials prepared by the material preparation system are obtained by the feeding system, wherein the third preset time is shorter than both the first preset time and the second preset time; and a grasping device, configured to grasp the materials prepared by the material preparation system into the charging machine after the first preset time in response to the charging request, wherein the first preset time is longer than the third preset time and shorter than the second preset time.

6. The single crystal furnace charging system according to claim 1, wherein the control system is a single crystal silicon production management system storing information of a crucible in the single crystal furnace.

7. The single crystal furnace charging system according to claim 1, wherein there is a plurality of silicon material preparation boxes, and a weight of the silicon material in each of the plurality of silicon material preparation boxes is preset as the preset feeding amount.

8. The single crystal furnace charging system according to claim 1, wherein the dopant in the storage box is uniformly prepared as particles having a standard weight.

9. The single crystal furnace charging system according to claim 1, wherein the dopant preparation device further includes a temperature adjustment element configured to obtain temperature data in the storage box, and adjust temperature in the storage box based on the temperature data.

10. The single crystal furnace charging system according to claim 5, wherein the transport system includes a transport vehicle configured to transport the charging machine, a coordinating unit configured to generate a transport instruction in response to the charging request, and a second control unit configured to receive the transport instruction and control the transport vehicle to perform transportation in response to the transport instruction.

11. The single crystal furnace charging system according to claim 5, wherein the grasping device includes a grasping component, a third control unit and a detection component; the detection component is configured to identify a detection identifier based on the charging request, and obtain a first information of the detection identifier, and feedback the first information to the third control unit; the third control unit is configured to send a grasping instruction to the grasping component based on the first information, and the grasping component is configured to grasp a silicon material preparation box corresponding to an identified detection identifier based on the grasping instruction.

12. The single crystal furnace charging system according to claim 11, wherein an information identifier including a type number of the silicon material in the silicon material preparation box is provided at an outside of the silicon material preparation box, and the detection component is further configured to identify the information identifier to obtain the type number of the silicon material in the silicon material preparation box, to double check the type number of the silicon material in the silicon material preparation box.

13. The single crystal furnace charging system according to claim 2, wherein an adjustment base is installed at a bottom of the charging machine, and the adjustment base is configured to drive the charging machine to move horizontally or vertically, in response to the transport vehicle transporting the charging machine to a preset position, the adjustment base is configured to move horizontally or vertically to drive the charging machine to move.

14. A charging method, applied to a single crystal furnace charging system, wherein the single crystal furnace charging system includes a control system, a material preparation system, a feeding system and a calibration system, the feeding system includes a comparing unit and a charging machine, and the charging method includes:
sending, by the control system, a charging request;
receiving, by the material preparation system, the charging request, and preparing, by the material preparation system, materials based on the charging request;
receiving, by the feeding system, the charging request, and obtaining, by the feeding system, the materials prepared by the material preparation system after a first preset time based on the charging request;
comparing, by the comparing unit, an actual feeding amount with a preset feeding amount to obtain a difference between the actual feeding amount and the preset feeding amount;
charging, by the charging machine, in response to the difference between the actual feeding amount and the preset feeding amount being within a first preset threshold, a single crystal furnace based on the charging request after a second preset time; and
obtaining, by the calibration system, a total charging weight in the single crystal furnace and a difference between the total charging weight and the preset feeding amount of the single crystal furnace, and, in response to the difference between the total charging weight and the preset feeding amount of the single crystal furnace being within a second preset threshold, updating, by the calibration system, a total charging amount in the single crystal furnace to the total charging weight,
wherein the materials include silicon material and dopant, and preparing, by the material preparation system, materials based on the charging request includes:
providing the material preparation system, wherein the material preparation system includes a first control unit, a feeding machine and a weight measurement element, wherein the feeding machine includes a silicon material preparation box configured to store the silicon material of a preset weight, and a dopant preparation device including a storage box, wherein the dopant is stored in the storage box, the storage box includes a discharge port, and the dopant is output to the silicon material preparation box through the discharge port;
generating, by the first control unit, a preparation instruction in response to the charging request;
measuring, by the weight measurement element, a weight of a dopant to be output in response to the material preparation instruction;
in response to the weight of the dopant to be output being within a preset weight range, outputting the dopant to be output to the silicon material preparation box through the discharge port; and
in response to the weight of the dopant to be output being not within the preset weight range, adjusting an amount of the dopant to be output and remeasuring the weight of the dopant to be output, until the weight of the dopant to be output falls within the preset weight range.

15. The charging method according to claim 14, wherein obtaining, by the feeding system, the materials prepared by the material preparation system after the first preset time based on the charging request includes:
providing the feeding system and a transport system;
receiving, by the transport system, the charging request, transporting, by the transport system, to the feeding machine after a third preset time based on the charging request to obtain prepared materials, and transporting, by the transport system, the charging machine to the single crystal furnace after the prepared materials are obtained by the feeding system, wherein the third preset time is shorter than both the first preset time and the second preset time; and
providing a grasping device, wherein the grasping device grasp the material prepared by the material preparation system into the charging machine after the first preset time in response to the charging request, and the first preset time is longer than the third preset time and shorter than the second preset time.

16. The charging method according to claim 14, wherein comparing, by the control system, the actual feeding amount with the preset feeding amount to obtain the difference between the actual feeding amount and the preset feeding amount includes:
weighing, by a weighing unit, the materials in the charging bin and obtain a first feeding amount, which is the actual feeding amount;
receiving, by the comparing unit, the first feeding amount, and comparing, by the comparing unit, the first feeding amount with the preset feeding amount to obtain a first difference between the first feeding amount and the preset feeding amount; and
receiving, by a determining unit, the first difference, and determining, by the determining unit, whether the first difference is within the first preset threshold or not.

17. The charging method according to claim 14, wherein charging the single crystal furnace includes:
providing the feeding system and a transport system;
transporting, by the transport system, the charging machine to the single crystal furnace, and positioning the charging machine, to cause the charging machine to be connected to the single crystal furnace;

charging, by the charging machine, the single crystal furnace, and in response to the feeding system charging the single crystal furnace, performing, by a weighing unit, real-time detection on a remaining feeding amount in the charging bin, and obtaining, by the weighing unit, a second difference between the remaining feeding amount and the first feeding amount, and transmitting, by the weighing unit, the second difference to the control system; and receiving, by the control system, the second difference, and comparing, by the control system, the second difference with the preset feeding amount, and determining whether a difference between the second difference and the preset feeding amount is within a third preset threshold or not, in response to the difference between the second difference and the preset feeding amount being within the third preset threshold, control the feeding system to stop charging the single crystal furnace.

18. The charging method according to claim 17, wherein updating, by the calibration system, the total charging amount in the single crystal furnace to the total charging weight includes:

obtaining a remaining amount in the single crystal furnace before the single crystal furnace is charged by the charging machine;

obtaining the second difference after the single crystal furnace is charged by the charging machine; and providing a comparing device and a calibration system, obtaining, by the comparing device, an original remaining amount in the single crystal furnace and the second difference, and obtaining, by the comparing device, a third difference between a sum of the original remaining amount and the second difference and the preset feeding amount, in response to the third difference between the sum of the original remaining amount and the second difference and the preset feeding amount being within the second preset threshold, updating, by the calibration system, the total charging amount in the single crystal furnace to the total charging weight, wherein the total charging weight is the sum of the original remaining amount and the second difference.

19. A single crystal furnace charging system, comprising:
a control system, configured to send a charging request;
a material preparation system, configured to receive the charging request and prepare materials based on the charging request;
a feeding system, including a comparing unit and a charging machine; wherein the feeding system is configured to receive the charging request, obtain the materials prepared by the material preparation system after a first preset time based on the charging request, the comparing unit is configured to compare an actual feeding amount with a preset feeding amount to obtain a difference between the actual feeding amount and the preset feeding amount, and the charging machine is configured to, in response to the difference between the actual feeding amount and the preset feeding amount being within a first preset threshold, charge a single crystal furnace based on the charging request after a second preset time; and a calibration system, configured to obtain a total charging weight in the single crystal furnace, obtain a difference between the total charging weight and the preset feeding amount of the single crystal furnace, and, in response to the difference between the total charging weight and the preset feeding amount of the single crystal furnace being within a second preset threshold, update a total charging amount in the single crystal furnace to the total charging weight;

wherein the feeding system further includes a weighing unit and a determining unit, wherein:

the charging machine includes a charging bin configured to store the materials;

the weighing unit is configured to weigh the materials in the charging bin and obtain a first feeding amount, which is the actual feeding amount;

the comparing unit is configured to receive the first feeding amount and compare the first feeding amount with the preset feeding amount to obtain a first difference between the first feeding amount and the preset feeding amount; and the determining unit is configured to receive the first difference and determine whether the first difference is within the first preset threshold, and in response to the first difference being within the first preset threshold, determine that it is time for the feeding system to charge the single crystal furnace.

20. The single crystal furnace charging system according to claim 19, wherein the weighing unit is further configured to, in response to the feeding system charging the single crystal furnace, perform real-time detection on a remaining feeding amount in the charging bin, obtain a second difference between the remaining feeding amount and the first feeding amount, and transmit the second difference to the control system; and the control system is further configured to receive the second difference, and compare the second difference with the preset feeding amount to obtain a difference between the second difference and the preset feeding amount, in response to the difference between the second difference and the preset feeding amount being within a third preset threshold, control the feeding system to stop charging the single crystal furnace.

* * * * *